United States Patent [19]

Higashisaka

[11] Patent Number: 4,931,669
[45] Date of Patent: Jun. 5, 1990

[54] HIGH SPEED LOGIC CIRCUIT HAVING OUTPUT FEEDBACK

[75] Inventor: Norio Higashisaka, Hyogo, Japan

[73] Assignee: Mitsubishi Denki Kabushiki Kaisha, Tokyo, Japan

[21] Appl. No.: 167,088

[22] Filed: Mar. 11, 1988

[30] Foreign Application Priority Data

Mar. 11, 1987 [JP] Japan .................................. 62-55850

[51] Int. Cl.$^5$ .................... H03K 17/30; H03K 17/687
[52] U.S. Cl. .................................... 307/448; 307/450; 307/443; 307/263
[58] Field of Search ............... 307/446, 443, 448, 450, 307/451, 475, 571, 263, 544, 546, 548, 264, 580, 290, 473

[56] References Cited

U.S. PATENT DOCUMENTS

| | | | |
|---|---|---|---|
| 4,216,390 | 8/1980 | Stewart | 307/264 |
| 4,661,726 | 4/1987 | Biard | 307/448 |
| 4,697,110 | 9/1987 | Masuda et al. | 307/475 |
| 4,743,782 | 5/1988 | Nelson et al. | 307/448 |

FOREIGN PATENT DOCUMENTS 0103232  6/1983  Japan .................................. 307/448

OTHER PUBLICATIONS

Christopherson, "FET Hysteresis Circuit", IBM Tech. Bulletin, vol. 15, No. 5, Oct. 1, 1972, pp. 1475-1476.
IEEE, Intl. Sol. St. Circuits: "A 64K GaAs Gate Array", by T. Terada et al., Feb. 26, 1987, pp. 144-145.
IEEE, Cus. Int. Circuits: "GaAs Gate Array Designs Using the Capacitor Diode FET Logic Approach", by F. S. Lee et al., 1986, pp. 513-516.
IEEE Cus. Int. Circuits: "The Design and Performance of a GaAs 2K Gate Array", by A. Peczalski et al., 1986, pp. 517-520.

Primary Examiner—Stanley D. Miller
Assistant Examiner—Timothy P. Callahan
Attorney, Agent, or Firm—Lowe, Price, LeBlanc, Becker & Shur

[57] ABSTRACT

In an NOR logic circuit employing an MES (Metal Semiconductor Junction) field effect transistors, an MES field effect transistor 2 for driving an output stage operates in response to an input signal applied to an input terminal 101 or 102 to output an output signal from an output terminal 200. In this operation, an MES field effect transistor 4 for pull-down of input operates in response to an output signal fed back by a feedback circuit comprising a diode 5 and a current power supply transistor 3 to charge and discharge the gate of the transistor 2. Therefore, the transistor 2 can operate promptly and, as a result, the logic circuit can be operated at a high operating speed.

17 Claims, 3 Drawing Sheets

LPFL CIRCUIT

HIGH SPEED LOGIC CIRCUIT HAVING OUTPUT FEEDBACK

BACKGROUND OF THE INVENTION

1. Field of the Invention

The present invention relates to a logic circuit and, more particularly, to a logic circuit having a high operating speed.

2. Description of the Prior Art

With the recent development of the advanced information-oriented society, a semiconductor integrated circuit device of high speed, high integration and low power consumption is increasingly demanded. Especially, electronic devices using compound semiconductors in III to V groups such as GaAs instead of conventional silicon have been energetically studied and developed to satisfy this demand.

As examples of transistors using GaAs, an MESFET (Metal Semiconductor Junction Field Effect Transistor), an HEMT (High Electron Mobility Transistor), an HBT (Hetero Junction Bipolar Transistor), an RHET (Resonant Hot Electron Transistor) and the like are proposed. Since the HEMT, HBT and RHET need advanced processing techniques, such as epitaxial growth by MBE Molecular Beam Epitaxy), MO-CVD (Metal Organic-Chemical Vapor Deposition) and the like, it will take some time to use them practically. On the other hand, as for the MESFET, a 16 K S RAM, a 3 KG gate array and the like are disclosed, and a product integrated on an LSI level is now at the beginning of its practical use.

Logic circuits using GaAs MESFET, which have been proposed, are for example circuits of DCFL (Direct Coupled FET Logic), BFL (Buffered FET Logic), SCFL (Source coupled FET Logic , LPFL (Low Pinchoff-Voltage FET Logic), and SDFL (Schottky-Diode FET Logic).

FIG. 1 is a schematic diagram showing one example of a conventional DCFL circuit. Referring to FIG. 1, the DCFL circuit comprises inverters 10 and 11 in two stages connected between a power supply $V_{DD}$ and the ground GND. The inverter 10 of the first stage comprises a load transistor 1 formed by a depletion MESFET and a drive transistor 2 formed by an enhancement MESFET, those transistors 1 and 2 being connected in series. The drain of the transistor 1 is connected to the power supply $V_{DD}$ The gate and source of the transistor 1 and the drain of the transistor 2 are connected together to constitute an output of the inverter 10. The source of the transistor 2 is connected to the ground. The gate of the transistor 2 is connected to an input terminal 100. The inverter 11 of the second stage comprises a load transistor 7 formed by a depletion MESFET and a drive transistor 8 formed by an enhancement MESFET, those transistors 7 and 8 being connected in series. The drain of the transistor 7 is connected to the power supply $V_{DD}$. The gate and source of the transistor 7 and the drain of the transistor 8 are connected together to constitute an output of the inverter 11. The source of the transistor 8 is connected to the ground GND. The gate of the transistor 8 is connected to the output of the inverter 10. The output of the inverter 11 is connected to an output terminal 200 of this DCFL circuit.

The DCFL circuit comprises a few elements which are simply connected. Since the DCFL circuit operates at the highest speed with less power consumption among now proposed circuits, it has been employed in a memory device and many other LSI's. On the other hand, however, the DCFL circuit has a defect that a high level of output $V_{OH}$ at the first stage is limited below a clamp voltage of the transistor at the second stage. More specifically, referring to FIG. 1, the output voltage of the inverter 10 of the first stage is limited by the clamp voltage between the gate and source of the drive transistor 8 of the inverter 11 of the second stage. In general, the high-level output $V_{OH}$ of the inverter 10 is limited below 0.6 V because the clamp voltage between the gate and source of the MESFET is approximately 0.6 V. A low level of output $V_{OL}$ is approximately 0.1 V. Therefore, the output of the inverter has a logic amplitude $V_L$ of approximately 0.5 V. An ECL (Emitter Coupled Logic) circuit employing a silicon bipolar transistor operates within the range of the logic amplitude of approximately 0.5 V because the logic level is determined, using a well-controllable base-emitter voltage $V_{BE}$ or resistance ratio. In the case of the DCFL circuit employing the MESFET, since the logical level is affected by variable parameters such as, for example, a threshold voltage $V_{TH}$ and current characteristics, it is very difficult to assure a sufficient noise margin with the logic amplitude of approximately 0.5 V and to mass-produce a large scale integrated circuit. A BFL circuit shifts a level of an output voltage by a source follower provided at the output stage to obtain a large logic amplitude.

FIG. 2 is a schematic diagram showing one example of a conventional BFL circuit. Referring to FIG. 2, the BFL circuit comprises a logic branch 30 at a first stage and a source follower circuit 31 at a second stage 31. The logic branch 30 comprises a load transistor 9 formed by a depletion MESFET and a drive transistor 12 formed by a depletion MESFET, those transistors 9 and 12 being connected in series between a first power supply $V_{DD}$ and the ground GND. The drain of the transistor 9 is connected to the power supply $V_{DD}$. The gate and source of the transistor 9 and the drain of the transistor 12 are connected together to constitute an output of the logic branch 30. The source of the transistor 12 is connected to the ground GND. The gate of the transistor 12 is connected to an input terminal 100. The source follower circuit 31 comprises a source follower transistor 20 formed by a depletion MESFET, a level shift diode 21 and a constant-current source transistor 22 formed by a depletion MESFET, which are connected in series between the power supply $V_{DD}$ and a power supply $V_{SS}$. The transistor 20 has its drain connected to the power supply $V_{DD}$, its source connected to an anode of the level shift diode 21 and its gate connected to the output of the logic branch 30. The drain of the transistor 22 is connected to a cathode of the diode 21 to constitute an output of the source follower circuit 31. The transistor 22 has its gate and its source connected together to the power supply $V_{SS}$. The output of the source follower circuit 31 is connected to an output terminal 200.

Since the logic amplitude $V_L$ can be appropriately set by changing the number of the level shift diodes 21 in the source follower 31 in the BFL circuit shown in FIG. 2, the difficulty in manufacture caused by the small logic amplitude $V_L$ as in the DCFL circuit can be removed. On the other hand, in the BFL circuit, the level shifting performed in the output stage through which a large amount of current flows and the supply voltage of the level shift stage is high. Accordingly, power consumption of the BFL circuit is equal to or more than that of the ECL circuit of silicon.

FIG. 3 is a schematic diagram showing one example of a conventional SDFL circuit. In the SDFL circuit, the level shifting is performed in the input stage to reduce power consumption. The SDFL circuit in FIG. 3 is an NOR circuit having two inputs. Referring to FIG. 3, the SDFL circuit comprises an input-stage circuit and an output-stage circuit. The input-stage circuit comprises input level shift diodes 6a and 6b having anodes connected to input terminals 101 and 102, respectively for shifting the level of the input voltage and it further comprises an input pull-down transistor 4 formed by a depletion MESFET. The cathodes of the diodes 6a and 6b and the drain of the transistor 4 are connected together to constitute an output of the input stage circuit. The gate and source of the transistor 4 is connected together to a power supply $V_{SS}$. The output-stage circuit comprises a load transistor 1 formed by a depletion MESFET, and a drive transistor 2 formed by an enhancement MESFET, which are connected in series between the power supply $V_{DD}$ and the ground GND. The drain of the transistor 1 is connected to the power supply $V_{DD}$. The gate and source of the transistor 1 and the drain of the transistor 2 are connected together to constitute an output of the output stage circuit. The source of the transistor 2 is connected to the ground GND. The gate of the transistor 2 is connected to the output of the input stage circuit. The output of the output stage circuit is connected to an output terminal 200 of this SDFL circuit.

Description is now made as to operation of the SDFL circuit shown in FIG. 3.

The levels of the input voltages applied to the input terminals 101 and 102 are shifted by the input level shift diodes 6a and 6b, respectively, and applied to the gate of the drive transistor 2. The input pull-down transistor 4 functions as a constant-current source for supplying a substantially constant current flow into the input level shift diodes 6a and 6b. Assuming that the voltages, the levels of which are shifted by the input level shift diodes 6a and 6b, are approximately 0.6 V, the levels of the input voltages are shifted by approximately 0.6 V because the diodes 6a and 6b are provided in the input terminals 101 and 102, respectively. When a high-level voltage is applied from the input terminals 101 and 102 to the gate of the drive transistor 2 through the diode 6a or 6b, the logical level of the gate is clamped at approximately 0.6 V which is a clamp voltage between the source and the gate in the same manner as in the case of the DCFL circuit. On the other hand, when a low-level voltage, for example, 0.1 V is applied to the input terminal 101 and 102, the voltage of the gate of the transistor 2 is brought to −0.5 V by the level shifting of 0.6 V. Therefore, the logic amplitude $V_L$ of 1.1 V is provided and it is more than two times as large as the logic amplitude of 0.5 V in the DCFL circuit. Thus, the circuit is hardly affected by the change of the device parameter such as the threshold voltage $V_{TH}$. In addition, since the level shifting is performed in the input stage in this SDFL circuit, a current flowing through the level shifting portion is small and power consumption is less than that of the BFL circuit. Although the enhancement MESFET is shown as the drive transistor 2 in FIG. 3, the depletion MESFET may be used for that.

FIG. 4 is a schematic diagram showing one example of a conventional LPFL circuit. The LPFL circuit in FIG. 4 is an NOR circuit having two inputs. Referring to FIG. 4, the gate and source of the input pull-down transistor 4 in the input stage are connected together to the ground GND compared with the SDFL circuit in FIG. 3. Other portions of the circuit are the same as that of the SDFL circuit shown in FIG. 3 and therefore description thereof is omitted.

Since in this LPFL circuit, the portion of the input level shift circuit in the input stage is not connected to the power supply $V_{SS}$ as in the SDFL circuit but is connected to the ground GND, there is an advantage that only one power supply is needed. However, it has a defect that the logic amplitude of the input voltage applied to the gate of the drive transistor 2 is reduced while the logic amplitude applied to the input terminal 101 or 102 is large. However, since the input voltage having the larger logic amplitude than that in the case of the DCFL circuit is applied to the LPFL circuit, the LPFL circuit is hardly affected by the noise from outside. When the voltage of a low level is applied to the gate of the transistor 2, the gate of the transistor 2 is brought to approximately 0V by the operation of the input pull-down transistor 4 and, as a result, the LPFL circuit allows a margin of approximately 100 mV for the logic amplitude as compared with the DCFL circuit.

The conventional SDFL circuit has the following disadvantages. Referring to FIG. 3, when the input voltage is changed from the high level to the low level, it is necessary to immediately discharge a capacitance $C_{GS}$ between the gate and the source of the drive transistor 2. In addition, when the input voltage is changed from the low level to the high level, it is necessary to immediately charge the gate capacitance $C_{GS}$ of the transistor 2. In order to promptly charge and discharge the gate capacitance $C_{GS}$ of the transistor 2, it is necessary to increase a channel width of the input pull-down transistor 4. However, the increase in the channel width of the transistor 4 causes a decrease in the fan-out of the logic circuit of the first stage connected to the input terminal 101 and 102 because a current flowing into the level shifting portion of the input in the input-stage circuit is applied from the load transistor of the logic circuit of the first stage and it is necessary to increase power capacity of the circuit of the first stage.

As described above, the two requirements, that is, a higher operating speed in the SDFL circuit shown in FIG. 3, and an increase in the fan-out of the circuit of the first stage can not be satisfied at the same time.

The prior art of interest to a logic circuit in accordance with the present invention is disclosed in a paper "A 64 K GaAs Gate Array" by Toshiyuki Terada et al., in ISSCC (International Solid-State Circuits Conference) of IEEE held Feb, 26, 1987. This paper states that both high-speed operation and a wide noise margin in a logic circuit can be brought about because input level shift diodes can operate as feedforward capacitance.

Another prior art of interest to the logic circuit in accordance with the present invention is disclosed in a paper "GaAs Gate Array Designs Using the Capacitor Diode FET Logic (CDFL) Approach" presented by F. S. Lee et al., in Custom Integrated Circuits Conference of IEEE held in 1986. This paper states that high speed operation of a logic circuit can be attained by connecting input level shift diodes to a feedforward capacitance in parallel.

Still other prior art of interest to the logic circuit in accordance with the present invention is disclosed in a paper, "The Design and Performance of a GaAs 2 K Gate Array" presented by Andrzej Peczalski et al., in Custom Integrated Circuits Conference of IEEE held in 1986. This paper describes the bootstrap SDFL circuit in which a series connection of two diodes is connected to a pull-up transistor in parallel in order to increase load driving ability.

SUMMARY OF THE INVENTION

A primary object of the present invention is to provide a logic circuit having a high operating speed.

Another object of the present invention is to provide a logic circuit which makes it possible to decrease power consumption of an entire circuit including the logic circuit by increasing the fan-out of the logic circuit connected at a first stage on the input side of the entire circuit.

In brief, the present invention comprises a first series connection including first resistor means and a first field effect device of a conductivity type connected between a first power supply and the ground, level-shifting means for shifting the level of an input signal applied to an input to supply the signal to a gate of the first field effect device, a second field effect device of a conductivity type connected between an output of the level-shifting means and a second power supply, and feedback means for feeding back an output signal to a gate of the second field effect device, the feedback means being connected between an output formed by an intersection of the first resistor means and the first field effect device, and the gate of the second field effect device.

According to the present invention, the first field effect device operates in response to the signal applied from the input to the gate through the level-shifting means to output the output signal. The second field effect device operates in response to the signal from the output fed back by the feedback means to charge or discharge the gate of the first field effect device. Therefore, the gate of the first field effect device can be promptly charged or discharged and, as a result, the first field effect device can be promptly conducted or cut off. On the other hand, the second field effect device can prevent a current from flowing from the other circuit of the first stage connected to the input of this logic circuit, so that output capacity at the first stage can be reduced.

According to the present invention, advantages are brought about in that a logic circuit with higher operating speed can be provided and the fan-out at the first stage at the input can be increased.

In a preferred embodiment, the feedback means comprises a second series connection between impedance means and second resistor means and an intersection thereof is connected to the gate of the second field effect device.

In the above mentioned preferred embodiment, a signal from the output can be applied to the gate of the second field effect device through the impedance means in a stable manner because a current from the output is caused to flow into the ground by the second resistor means. Therefore, the second field effect device can be operated in a stable manner.

The above described preferred embodiment has an advantage that the logic circuit is operated in a stable manner.

In another preferred embodiment, impedance means comprises capacitance means. Since the capacitance means applies only an AC component of an output signal to the gate of the second field effect device and does not apply a DC component to that gate, power consumption can be reduced.

In still another preferred embodiment, impedance means comprises third resistor means. The third resistor means shifts the level of the output signal to apply it to the gate of the second field effect device even if the change of the output signal is slow. Accordingly, a logic circuit having a wide range of operating speed can be obtained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
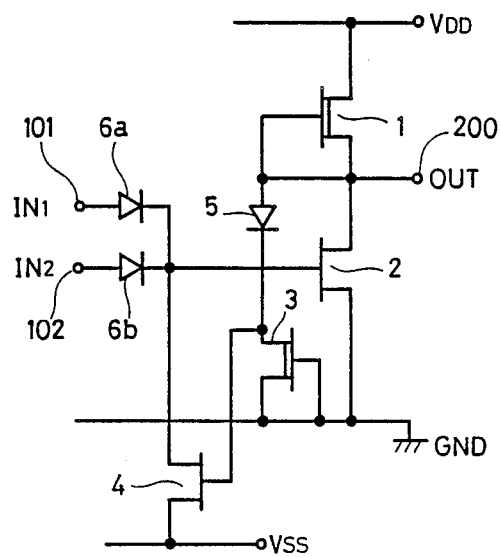
FIG. 5 is a schematic diagram showing a logic circuit showing one embodiment of the present invention.

FIG. 5 is a schematic diagram showing a logic circuit employing an MESFET according to one embodiment of the present invention. This circuit is an NOR circuit having two inputs, which is related with a conventional SDFL circuit. Referring to FIG. 5, the logic circuit comprises an input stage circuit, an output stage circuit and a feedback circuit for feeding back an output signal to the input stage circuit. The input stage circuit comprises input level shift diodes 6a and 6b having anodes connected to input terminals 101 and 102, respectively, to shift the level of an input voltage, and further comprises an input pull-down transistor 4 formed by an enhancement MESFET. The cathodes of the diodes 6a and 6b and the drain of the transistor 4 are connected together to constitute an output of the input stage circuit. The source of the transistor 4 is connected to a power supply $V_{SS}$ for supplying an output voltage of $-0.7$ V. The output stage circuit comprises a load transistor 1 formed by a depletion MESFET and a drive transistor 2 formed by an enhancement MESFET, those transistors 1 and 2 being connected in series between the power supply $V_{DD}$ for supplying an output voltage of 1.6 V and the ground GND. The drain of the transistor 1 is connected to the power supply $V_{DD}$. The gate and source of the transistor 1 and the drain of the transistor 2 are connected together to constitute an output of the output stage circuit. The transistor 2 has its source connected to the ground GND and its gate connected to the output of the input stage circuit. The output of the output stage circuit is connected to an output terminal 200. The feedback circuit comprises a feedback diode 5 and a feedback pull-down transistor 3 formed by a depletion MESFET. The output of the output stage circuit is connected to an anode of the diode 5. A cathode of the diode 5, the drain of the transistor 3 and the gate of the transistor 4 of the input stage are connected together. A feedback signal from the output stage circuit is applied to the gate of the transistor 4. The transistor 3 has its gate and source connected together to the ground GND.

Now, description is made of operation of the above described logic circuit.

A current flowing into the input pull-down transistor 4 is controlled by a voltage, the level of which is shifted by the diode 5 by approximately 0.6 V from an output voltage of the output stage. When at least one of input signals applied to the input terminals 101 and 102 has a high level voltage, the capacitance $C_{GS}$ between the gate and the source of the transistor 2 is charged and a low-level signal is outputted from the output terminal 200. The transistor 4 is cut off. Then, when the input signals are changed together to the low level, the transistor 4 is conducts in response to the output voltage that same time at the output voltage starts to rise. The output voltage is promptly raised when the gate capacitance $C_{GS}$ between the gate and the source of the transistor 2 is promptly discharged through the transistor 4. In addition, when at least one of the input signals changes to the high level, the transistor 2 is rendered conductive and the output voltage is started to decrease. The transistor 4 is turned off in response to the decrease of the output voltage and the gate capacitance $C_{GS}$ of the transistor 2 is promptly charged. Therefore, the output voltage is rapidly decreased because the transistor 2 is promptly conducted.

As described above, since the input pull-down transistor is controlled by feeding back the output voltage so that the gate capacitance $C_{GS}$ of the transistor 2 is charged and discharged, the output signal can be changed rapidly when the input signal is changed, and thus, the logic operation of this circuit can be performed at high speed.

When at least one of the input signals is at the high level, the transistor 4 is turned off and, as a result, a current is prevented from flowing from the circuit at the first stage with the input terminals 101 or 102. Therefore, the fan-out of the circuit of the first stage can be increased. When both input signals are at the low level, the transistor 4 is turned on and a current flows into the transistor 4. Although the flow of this current causes the output low level $V_{OL}$ of the input stage to decrease, the fan-out of the circuit connected to the first stage with the input terminals 101 or 102 is not affected thereby. The increase of the fan-out of the logic circuit makes it possible to reduce the whole power consumption of the logic circuit. If the fan-out is small, it needs to increase components of the circuit, for example, by adding buffers, which would cause complication of the circuit and an increase in power consumption of the circuit.

Since the fan-out can be increased in accordance with the present invention, the logic circuit with low power consumption and high operating speed can be brought about.

Figure 1:
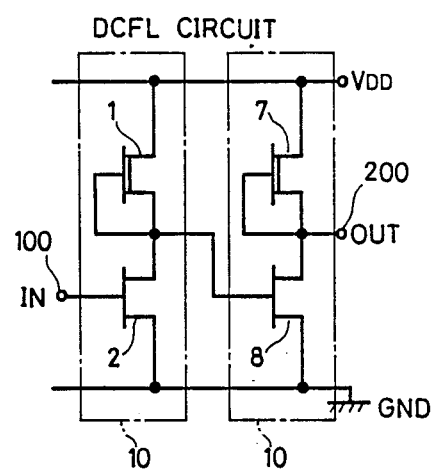
FIG. 1 is a schematic diagram showing a conventional DCFL (Direct Coupled FET Logic) circuit.
Figure 2:
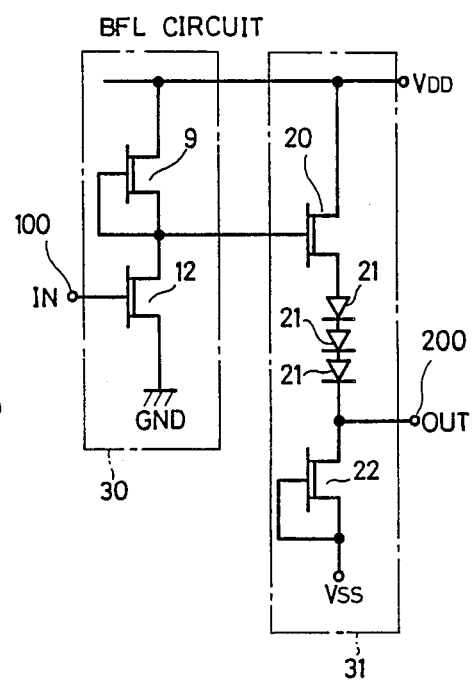
FIG. 2 is a schematic diagram showing a conventional BFL (Buffered FET Logic) circuit.
Figure 3:
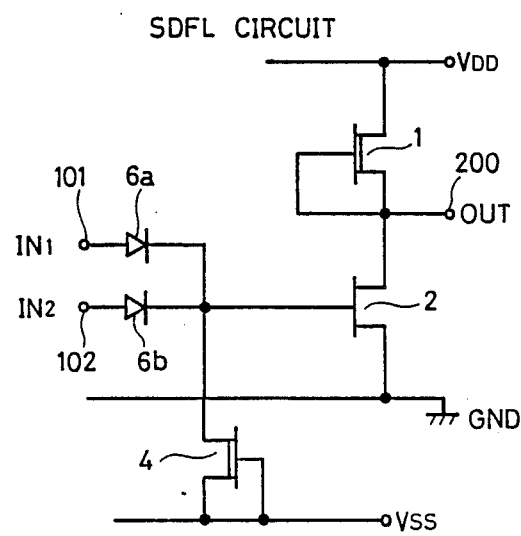
FIG. 3 is a schematic diagram showing a conventional SDFL (Shottky-Diode FET Logic) circuit.

Since the logic circuit shown in FIG. 5 additionally includes the feedback circuit as compared with the SDFL circuit in FIG. 3, power consumption is increased by an amount corresponding to of the power consumption in the feedback circuit. However, in view of a total amount of power consumption of the whole logic circuit including the circuit shown in FIG. 5, power consumption is obviously decreased.

Although an enhancement transistor is shown as the input pull-down transistor 4 in the logic circuit in FIG. 5, a depletion transistor may be applied instead of the enhancement transistor. When the depletion transistor is applied, a low current can flow into the depletion transistor 4 even if the input signals are at the high level. A current flows into the diodes 6a and 6b by causing a low current to flow into the transistor 4 and, as a result, the diodes 6a and 6b promptly transmit the change of the input signals to the gate of the transistor 2 when the input signals are changed to the low level.

Figure 4:
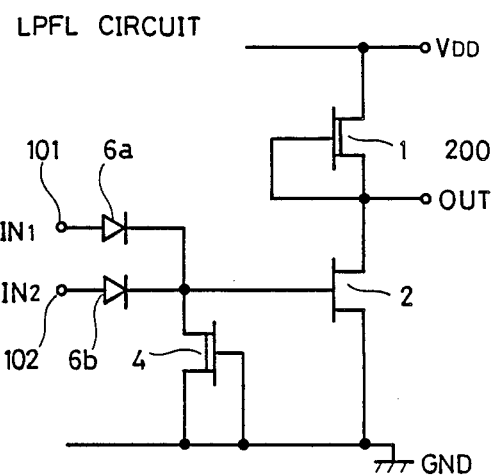
FIG. 4 is a schematic diagram showing a conventional LPFL (Low Pinchoff-Voltage FET Logic) circuit.
Figure 6:
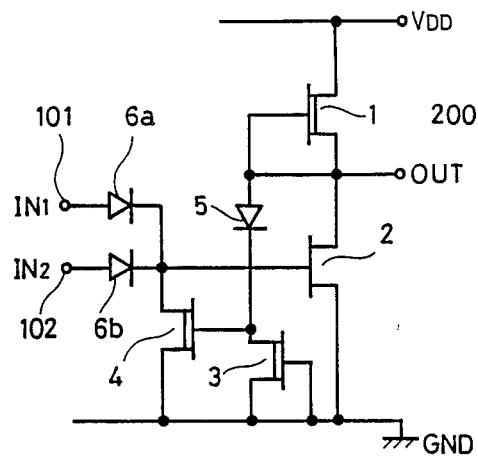
FIG. 6 is a schematic diagram of a logic circuit showing another embodiment of the present invention.

FIG. 6 is a schematic diagram of a logic circuit using MESFET showing another embodiment of the present invention. This circuit is an NOR circuit having two inputs, which is related with the conventional LPFL circuit. Referring to FIG. 6, the logic circuit further includes a feedback circuit for feeding back an output signal to the input stage circuit, in addition to input stage circuit and the output stage circuit as compared with the LPFL circuit in FIG. 4. The feedback circuit comprises a feedback diode 5 and a feedback pull-down transistor 3 formed by a depletion MESFET. The output of the output stage circuit is connected to the anode of the diode 5. The cathode of the transistor 5, the drain of the transistor 3 and the gate of the transistor 4 of the input stage are connected together. The feedback signal from the output stage circuit is applied to the gate of the transistor 4. The transistor 3 has its gate and source connected together to the ground GND. Since the other circuit components of the circuit of the input stage and the output stage are the same as those of the LPFC circuit in FIG. 4, the description thereof is omitted.

In operation, operation of this logic circuit is the same as that of the circuit shown in FIG. 5 and the same advantages can be obtained, that is, high operating speed and an increase of the fan-out of the logic circuit of the first stage can be realized.

Figure 7:
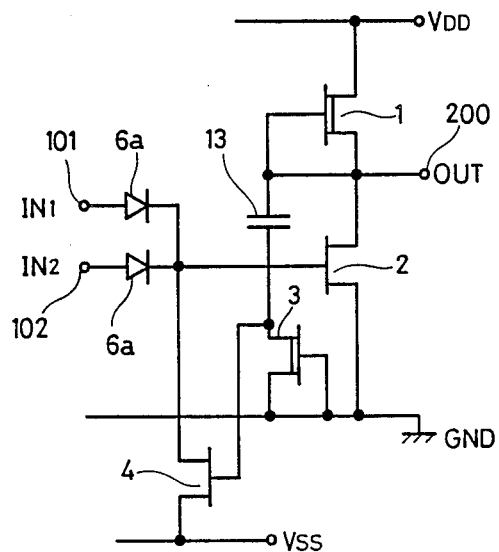
FIG. 7 is a schematic diagram of a logic circuit showing still another embodiment of the present invention.

FIG. 7 is a schematic diagram showing a logic circuit employing MESFET, of still another embodiment of the present invention. The logic circuit in FIG. 7 comprises the same components as those of the logic circuit in FIG. 5 except for a capacitor 13 which is connected to the circuit in FIG. 7 instead of the feedback diode 5.

In operation, the operation of the logic circuit is the same as that of the circuit in FIG. 5 and the same advantageous effect can be brought about. In addition, since the capacitor 13 is employed instead of the feedback diode 5, a DC current is prevented from flowing into the feedback circuit. Therefore, this logic circuit can operate with less power consumption than that of the circuit in FIG. 5, whereby output driving ability can be further increased. Another advantage brought about by using the capacitor 13 instead of the diode is that any fluctuation of the level of the output signal caused by change of the load connected to the output terminal 200 is not transmitted to the gate of the transistor 4. As described above, since the capacitor 13 transmits only AC components of the output signal, the fluctuation of the voltage of the gate of the transistor 4 caused by change of the load connected to the output can be reduced. Therefore, the gate of the transistor 2 can be charged and discharged in a stable manner because the transistor 4 operates in a stable manner. When the output signal promptly changes, it is advantageous to use the capacitor 13 shown in FIG. 7 in the feedback circuit and when the output signal slowly changes, it is advantageous to use the diode 5 shown in FIG. 5 in the feed back circuit. This is because the transistor 5 can transmit the slow change of the output signal to the gate of the transistor 4.

Description is made hereinafter of partial replaceability as to the fact of elements comprised in the circuit diagram showing the embodiments of the present invention, shown in FIGS. 5, 6 and 7, with other circuit elements.

The load transistor 1 and the feedback pull-down transistor 3 can be replaced with other resistor means, respectively. The feedback diode 5 also may be replaced with other resistor means. Although the input level shift diodes 6a and 6b may be replaced with other resistor means, it is necessary, for example, to prevent the input voltage from being applied extendedly between the input terminals 101 and 102 when the resistor means other than the diode is employed.

According to the present invention, a first field effect device for driving in an output stage operates in response to a signal applied from an input to the gate through level-shifting means to output an output signal. In this operation, a second field effect device operates in response to a signal fed back from an output by feedback means to charge or discharge the gate of the first field effect device. The first field effect device can promptly operate because the gate of the first field effect device can be charged and discharged by the operation of the second field effect device. Thus, a logic circuit with high operating speed can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic circuit having an input and an output and powered by first and second power supplies, comprising:
    level-shifting means connected to said input for shifting a level of an input signal;
    a first series connection of a first fixed value resistor means and a first field effect device having a source, a drain and a gate, connected between said first power supply and a ground;
    one terminal of said first fixed value resistor means being connected to said first power supply;
    another terminal of said first fixed value resistor means and the drain of the first field effect device being connected together to constitute said output;
    the source of said first field effect device being connected to the ground;
    the gate of said first field effect device being connected so as to receive an output signal of said level-shifting means;
    a second field effect device having a source, a drain and a gate, connected between the gate of said first field effect device and said second power supply, for discharging the gate of said first field effect device;
    the drain of said second field effect device being connected to the gate of said first field effect device;
    the source of said second field effect device being connected to said second power supply; and
    feedback means connected between the gate of said second field effect device and said output interconnecting the drain of said first field effect transistor and said first fixed value resistor means for feeding back an output signal to the gate of said second field effect device.

2. A logic circuit having an input and an output and powered by first and second power supplies, comprising:
    level-shifting means connected to said input for shifting a level of an input signal;
    a first series connection of a first resistor means and a first field effect device having a source, a drain and a gate, connected between said first power supply and a ground;
    one terminal of said first resistor means being connected to said first power supply;
    another terminal of said first resistor means and the drain of the first field effect device being connected together to constitute said output;
    the source of said first field effect device being connected to the ground;
    the gate of said first field effect device being connected so as to receive an output signal of said level-shifting means;
    a second field effect device having a source, a drain and a gate, connected between the gate of said first field effect device and said second power supply, for discharging the gate of said first field effect device;
    the drain of said second field effect device being connected to the gate of said first field effect device;
    the source of said second field effect device being connected to said second power supply; and
    feedback means connected between the gate of said second field effect device and said output for feeding back an output signal to the gate of said second field effect device;
    wherein said feedback means comprises a second series connection of an impedance means and second resistor means, which are connected between said output and said ground; and
    an intersection of said impedance means and said second resistor means is connected to the gate of said second field effect device.

3. A logic circuit in accordance with claim 2, wherein said impedance means comprises third resistor means.

4. A logic circuit in accordance with claim 3, wherein said third resistor means comprises first diode means for shifting the level of the output signal.

5. A logic circuit in accordance with claim 2, wherein said impedance means comprises capacitance means.

6. A logic circuit in accordance with claim 2, wherein said second resistor means comprises constant current source means for causing a constant current to flow into said impedance means.

7. A logic circuit in accordance with claim 1, wherein said first and second field effect devices comprise a metal semiconductor junction field effect device.

8. A logic circuit in accordance with claim 6, wherein said constant current source means comprises a third field effect device having a source, a drain and a gate,
    the drain of said third field effect device being connected to the gate of said second field effect device, and
    the source and the gate of said third field effect device being connected together to said ground.

9. A logic circuit in accordance with claim 1, wherein said first resistor means comprises a fourth field effect device having a source, a drain and a gate, the drain of said fourth field effect device being connected to said first power supply, and
the source and the gate of said fourth field effect device being connected together to said output.

10. A logic circuit having an input and an output and powered by first and second power supplies, comprising:

level-shifting means connected to said input for shifting a level of an input signal;
a first series connection of a first resistor means and a first field effect device having a source, a drain and a gate, connected between said first power supply and a ground;
one terminal of said first resistor means being connected to said first power supply;
another terminal of said first resistor means and the drain of the first field effect device being connected together to constitute said output;
the source of said first field effect device being connected to the ground;
the gate of said first field effect device being connected so as to receive an output signal of said level-shifting means;
a second field effect device having a source, a drain and a gate, connected between the gate of said first field effect device and said second power supply, for discharging the gate of said first field effect device;
the drain of said second field effect device being connected to the gate of said first field effect device;
the source of said second field effect device being connected to said second power supply; and
feedback means connected between the gate of said second field effect device and said output for feeding back an output signal to the gate of said second field effect device;
wherein said level-shifting means comprises second diode means connected with a polarity enabling conduction at a high-level input voltage applied to said input.

11. A logic circuit in accordance with claim 1, wherein said first and second field effect devices comprise an enhancement type transistor.

12. A logic circuit in accordance with claim 1, wherein said second field effect device comprises a depletion type transistor.

13. A logic circuit in accordance with claim 1, wherein said second power supply comprises said ground.

14. A logic circuit in accordance with claim 13, wherein said second field effect device comprises a depletion type transistor.

15. A logic circuit in accordance with claim 1, wherein said second field effect transistor comprises an n type transistor.

16. A logic circuit having an input and an output and powered by first and second power supplies, comprising:

level shifting means connected to said input for shifting a level of an input signal;
an output circuit performing a logic operation and containing said output and comprising a first series connection of a first fixed value resistor means and a first field effect device connected between said first power supply and a ground;
one terminal of said first fixed value resistor means being connected to said first power supply;
another terminal of said first resistor means and the drain of the first field effect device being connected together to constitute said output;
the source of said first field effect device being connected to the ground;
the gate of said first field effect device being connected so as to receive an output signal of said level-shifting means;
a second field effect device having a source, a drain and a gate, connected between the gate of said first field effect device and said second power supply, for discharging the gate of said first field effect device;
the drain of said second field effect device being connected to the gate of said first field effect device;
the source of said second field effect device being connected to said second power supply; and
feedback means connected between the gate of said second field effect device and said output interconnecting the drain of said first field effect transistor and said first fixed value resistor means for feeding back an output signal to the gate of said second field effect device.

17. A logic circuit having an input and an output and powered by a power supply having first and second voltage sources and a ground, comprising:

level-shifting means connected to said input for shifting a level of an input signal;
a first series connection of a first fixed value resistor means and a first field effect device having a source, a drain and a gate, connected between said first power supply and the ground;
one terminal of said first fixed value resistor means being connected to said first voltage source;
another terminal of said first fixed value resistor means and the drain of the first field effect device being connected together to constitute said output;
the source of said first field effect device being connected to the ground;
the gate of said first field effect device being connected so as to receive an output current of said level-shifting means; and
current control means comprising a second field effect transistor connected between said level-shifting means and said second voltage source and being responsive to an output signal at said output interconnecting the drain of said first field effect transistor and said first fixed value resistance means for controlling the output current of said level-shifting means.

* * * * *